United States Patent Office 3,591,378

Patented July 6, 1971

3,591,378
PROCESS FOR MAKING POSITIVE-WORKING RELIEF PLATE

Joseph H. Altman, Rochester, N.Y., assignor to Eastman Kodak Company, Rochester, N.Y.

No Drawing. Filed July 31, 1968, Ser. No. 748,968
Int. Cl. G03c 5/00; G03f 7/08
U.S. Cl. 96—35.1 8 Claims

ABSTRACT OF THE DISCLOSURE

Positive photomechanical reproductions are prepared from normally negative-working photosensitive compositions which comprise an organic solvent-soluble colloid and an oxygen-sensitive aryl azide sensitizer therefor, by first imagewise exposing the composition in the presence of oxygen, then overall exposing the composition in the absence of oxygen and developing an image by removing the composition from areas which have received both an imagewise and overall exposure.

This invention relates to a photographic reproduction process. In a particular aspect it relates to a positive-working process for making photomechanical reproductions.

The use of photosensitive compositions for various photomechanical purposes is known in the art. For example, such compositions have been used to prepare etching resists and have been employed in the preparation of lithographic printing plates.

One group of photosensitive compositions which has found wide use for photomechanical purposes is based on aryl azide-sensitized colloids such as organic solvent-soluble colloids (e.g., rubber or rubber-like materials). Upon exposure, compositions of this type are insolubilized in photo-exposed areas, but remain soluble in suitable solvents in nonphotoexposed areas. Thus, by appropriate exposure and development these compositions can be used to prepare an image composed of hardened, insolubilized photosensitive material. As presently used, these compositions are negative working; that is, the nonimage areas of the orginal become the image areas of the photomechanical reproduction and the image areas of the original become the nonimage areas of the photomechanical reproduction. In many instances it is desirable to prepare a positive photomechanical reproduction of the original image. If this group of photosensitive compositions is to be employed for such purposes, it has been necessary to prepare a negative reproduction of the original image and then use this negative image in exposing the photosensitive composition. In order to avoid this additional operating step when a positive image is desired, various photosensitive compositions have been formulated which are positive working.

However, this solution to the problem has created additional difficulties for the practitioner in the art. He must keep in stock, and be familiar with, two separate photosensitive compositions, one which is negative working and the other of which is positive working. Thus, there is a need for a single photosensitive composition which can be employed to produce both positive and negative photomechanical reproductions of an original.

Accordingly, it is an object of this invention to provide a novel process for preparaing positive photomechanical reproductions.

It is another object of this invention to provide a novel process for preparing positive photomechanical reproductions using normally negative-working photosensitive compositions.

It is still another object of this invention to eliminate the need for a plurality of photosensitive compositions for producing either positive or negative photomechanical reproductions.

It is a further object of this invention to provide a single photosensitive composition which can be used to obtain either positive or negative photomechanical reproductions.

The above and other objects of this invention will become apparent to those skilled in the art from the further description of the invention which follows.

The present invention provides a process for preparing positive photomechanical reproductions from a positive original using normally negative-working photosensitive compositions. This process comprises the steps of first imagewise exposing a layer of a photosensitive composition in the presence of oxygen, then overall exposing the photosensitive composition in the absence of oxygen, and finally developing a positive image by removing the photosensitive composition from those areas which received both an imagewise and an overall exposure. Upon exposure in the presence of oxygen, the photosensitive composition is desensitized in the exposed areas, which areas correspond to the nonimage areas of the original. The subsequent overall exposure hardens and insolubilizes the photosensitive composition in previously unexposed areas, which areas correspond to the image areas of the original, but does not insolubilize the photosensitive composition in previously exposed and desensitized areas. Thus, a positive image can be developed by removal of the soluble nonimage areas from the support on which the layer of the photosensitive composition is coated.

Photosensitive compositions which are useful in the practice of this invention are known in the art and have been previously described in such patents as Hepher et al. U.S. Pat. 2,852,379, Sagura et al. U.S. Pat. 2,940,853, Kodak British Pat. 886,100, and Kodak British Pat. 892,811. These photosensitive compositions comprise organic solvent-soluble colloid materials which can be insolubilized upon photoexposure, sensitized with oxygen-sensitive sensitizers, such as aryl azides. The term oxygen-sensitive, as used herein, denotes the fact that when photo-hardenable compositions containing these sensitizers are exposed to light in the presence of oxygen the colloid is not hardened, but remains soluble. Presumably this is the result of a preferential photoinduced reaction of the sensitizer with oxygen which destroys its ability to sensitize the insolubilization of the colloid.

Organic solvent-soluble colloid materials that can be advantageously employed in this invention to prepare photosensitive coating compositions include natural rubber, which is commonly known as sulfur vulcanizable rubber, oxidized rubbers such as are described in Stevens et al. U.S. Pat. 2,132,809, cyclized rubbers such as are described in Carson U.S. Pat. 2,371,736 and Osterhof U.S. Pat. 2,381,180, rubbery synthetic polymers and copolymers such as those prepared from 1,3-diolefins, e.g., 1,3-butadiene, isoprene, neoprene, etc., cyclized polyisoprene prepared, for example, as described in Journal of Polymer Science, Part A, vol. 2, No. 9, pp. 3969–3985 and 3987–4001 (1964), and copolymers of butadiene with various unsaturated compounds such as styrene, acrylonitrile, isobutylene, etc. Such synthetic copolymers are known commercially under trade names such as Buna S, Muna N, Butyl, Pliolite, and the like. These rubbers, natural and synthetic, are employed in preparing photosensitive coating compositions in the form of solutions or dispersions in aromatic rubber solvents, terpenes, esters, ketones, chlorinated hydrocarbons, etc., in concentrations of about from 1 to 40 percent by weight based on the total weight of the photosensitive coating composition.

Suitable oxygen-sensitive aryl azide compounds which can be employed in photosensitive compositions used in this invention include aryl azides such as those described in U.S. Pat. 2,852,379 which have the general formulae:

(1) $N_3-R-CH=CH-R_1$ (2) $N_3-R-\overset{\overset{O}{\|}}{C}-R_1$ and (3) $N_3-R-R_1$ wherein R represents a monocyclic arylene group such as phenylene, methylphenylene, nitrophenylene, etc., and $R_1$ represents a monocyclic aryl group such as phenyl, azidophenyl, tolyl, azidotolyl, etc.; those aryl azides described in British Pat. 886,100 which have the general formula:

(4)

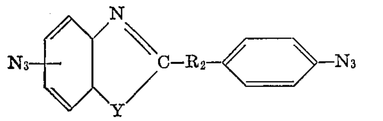

wherein $R_2$ represents a substituted or unsubstituted polymethine chain and Y represents a divalent atom or radical such as O, S, Se or NH; and those aryl azides described in U.S. Pat. 2,940,853 and British Pat. 892,811 which are composed of two azido-aryl nuclei linked by a chain of three or more carbon atoms, which chain includes the grouping $$-\underset{\underset{O}{\|}}{C}-\underset{|}{C}=$$

and which can be represented by the general formula:

(5)

$$N_3-R-CH=\underset{\underset{R_4}{|}}{C}-\overset{\overset{O}{\|}}{C}-R_5-R-N_3$$

wherein R represents a monocyclic arylene group, $R_5$ represents a $$-\underset{\underset{R_6}{|}}{C}=CH-$$

group or a chemical bond, and $R_4$ and $R_6$ represent hydrogen atoms or when taken together with the $$C-\overset{\overset{O}{\|}}{C}-C$$

group represent the atoms necessary to complete a cyclohexanone group which is unsubstituted or substituted with an alkyl group of 1 to 4 carbon atoms.

Representative of such aryl azides are 4,4′-diazidostilbene,
4,4′-diazidobenzophenone,
4,4′-diazidodiphenylmethane,
6-azido-2-(4′-azidostyryl)-benzimidazole,
6-azido-2-(4′-azidostyryl)-benzthiazole,
4-azido-2-(4′-azidostyryl)-benzoxazole,
4,4′-diazidochalcone,
2,6-di(4′-azidobenzal)-cyclohexanone,
2,6-di(4′-azidobenzal)-4-methylcyclohexanone,
4,4′-diazidodibenzalacetone, and
1,2-di(4-azidocinnamoyloxy)-ethane.

Particularly preferred are the 2,6-di(4′-azidobenzal)-4-alkylcyclohexanones wherein the alkyl group contains from 1 to 4 carbon atoms, e.g., methyl, ethyl, propyl, isopropyl, butyl, etc.

These aryl azide compounds are soluble in common organic solvents such as benzene, toluene, xylene, halogenated hydrocarbons, e.g., methylene chloride, chlorobenzene, trichloroethylene, etc., and the like. These solvents are also good solvents for the organic solvent-soluble colloids. The aryl azide sensitizers are incorporated in the coating composition in concentrations of about from 0.05 to 20 percent based on the total weight of the organic solvent-soluble colloid present.

Photosensitive elements useful in the practice of the present invention can be prepared by techniques well known in the art. Typically, a layer of the photosensitive composition is coated on a support. Suitable support materials include fiber base materials such as paper, polyethylene-coated paper, polypropylene-coated paper, parchment, cloth, etc., sheets of such metals as aluminum, copper, magnesium, zinc, etc.; glass; glass coated with such metals as chromium, chromium alloys (e.g., Nichrome alloys), steel, silver, gold, platinum, etc.; synthetic polymeric materials such as polyalkylmethacrylates (e.g., polymethylmethacrylate), polyester film base (e.g., polyethylene terephthalate), polyvinylacetals, polyamides (e.g., nylon), cellulose ester film base (e.g., cellulose acetate, cellulose acetate propionate, cellulose acetate butyrate), etc.; these synthetic polymeric materials coated with one of the metals referred to above as suitable for coating glass; and the like. Reference is made to Lydick et al. U.S. application Ser. No. 556,328, filed June 9, 1966, now U.S. Pat. No. 3,488,194, issued Jan. 6, 1970, for a further description of metal-coated glass and polymeric supports.

The optimum thickness at which the photosensitive composition is coated on the support can be readily determined by those skilled in the art. Inasmuch as the initial exposure requires the presence of oxygen to sensitize the photosensitive composition, the layer should not be so thick that oxygen cannot permeate through a substantial portion of its depth. Such factors as the permeability of the particular organic solvent-soluble colloid employed, and the nature of other constituents which may be present in the coating composition, will affect the optimum coating thickness. By an appropriate balance of the length of imagewise and overall exposure, a wide range of coating thicknesses can be employed. Thicknesses of about from 0.1 to 0.6 micron yield satisfactory results and are suitable for most purposes.

In practicing the process of the present invention, a layer of the photosensitive composition is exposed through an original to an appropriate light source in the presence of oxygen. The element is then removed from the presence of oxygen and is given an overall exposure with the same or a similar light source. Finally, an image is developed by removal of the photosensitive composition from those areas which have received both an imagewise and an overall exposure; i.e., the areas corresponding to the non-image areas of the original.

Sufficient oxygen to desensitize the photosenstive composition can be introduced into the photosensitive layer in a variety of ways. Exposure in still air or in an oxygen atmosphere is often sufficient. Alternatively, a jet of air or of oxygen can be directed at the surface of the element. Which procedure is employed will depend upon such factors as the nature of the organic solvent-soluble colloid, the sensitizer and the thickness of the coating. In some instances, depending upon the particular colloid, the particular sensitizer and the coating thickness, it may be desirable to insure that oxygen has permeated throughout the depth of the layer by directing the jet against the surface of the layer for a period of time prior to exposure.

Since these photosensitive compositions exhibit their greatest sensitivity in the blue and ultraviolet regions of the spectrum, light sources rich in such radiation should be employed. Suitable sources include mercury vapor lamps, carbon arcs, and the like. Since, the surface of the photosensitive layer must be maintained in contact with oxygen during exposure, techniques of exposure in which the original is in contact with the surface of the photosensitive layer are not practical. Thus, projection exposure is most suitable, although contact exposure through the base of the element can be employed if the support material is not opaque. The time of exposure can vary from several seconds to several minutes or more. The optimum time can be readily determined by those skilled in the art taking into consideration such factors as the particular photosensitive composition employed, the thickness of the coating, the light source, the distance of the light source from the element, the density of the original, etc.

After the element has been imagewise exposed, the original is removed and the element is given an overall exposure in the absence of oxygen. Oxygen can be excluded during this exposure by exposing the element in a vacuum or in an atmosphere of an inert gas, such as nitrogen. The overall exposure can be made with the same light source as was the imagewise exposure, or with a similar light source. Again, optimum time of exposure can be determined by those skilled in the art taking into account the factors enumerated above in connection with the discussion of the imagewise exposure.

Development of the photomechanical image can be effected by procedures well known in the art. A typical and highly useful method of development is to remove the unhardened nonimage areas with a solvent therefor, which is nonsolvent for the hardened image areas. Many of the organic solvents listed above as suitable coating solvents are satisfactory for this purpose. Especially useful developer solvents include xylene, monochlorobenzene, and trichloroethylene.

The following examples are included for a further understanding of the invention.

EXAMPLE 1

A coating solution is prepared by mixing 10 g. of a styrene-butadiene copolymer and 0.25 g. of 2,6-di(4'-azidobenzal)-4-methylcyclohexanone in a mixture of 50 cc. of xylene and 50 cc. of methyl Cellosolve acetate. This solution is coated to give a dry thickness of 0.3 micron on a sheet of glass on which has been vacuum deposited a thin film of chromium. The coating is allowed to dry and is then heated for 10 minutes at 90° C. to drive off any residual moisture. It is then exposed through a positive transparency to a 100 watt unfiltered AH 4 mercury arc (General Electric Co.) at a distance of about 40 inches for 16 seconds using as a projection lens a complete compound microscope with a Zeiss Planapochromat 0.32/10× objective and KPL 10× ocular. During exposure, compressed air is blown at the surface of the coating through air jets. The element is then placed in a vacuum chamber, the chamber is evacuated, and the element is overall exposed to a 100-watt PEK point mercury arc (PEK Co., Sunnyvale, Calif.) at a distance of about 13 inches for about 5 seconds. A positive image is developed by spraying the element with trichloroethylene to remove the unhardened coating composition from nonimage areas of the element. The element is then rinsed clean by spraying with a solution of monochlorobenzene and butyl acetate (1:10). After drying, there is obtained a positive resist image on the chromium coated glass sheet, the resist areas corresponding to the image areas of the positive transparency. The chromium can be removed from the unprotected areas by treatment with a chromium etchant, while the chromium protected by the resist remains on the glass sheet.

EXAMPLE 2

A coating solution is prepared as in Example 1 and is coated on a sheet of chromium plated glass to give a dry thickness of 0.6 micron. After drying, the element is exposed in air through a 0.6 neutral density positive transparency for 16 seconds to the exposure source described in the preceding example. The element is then given an overall exposure in a vacuum to a 1000 watt Master Model projector lamp at a distance of 2 feet. A positive image is developed as described in Example 1.

EXAMPLE 3

When Example 1 is repeated, but substituting for the 2,6-di(4'-azidobenzal)-4-methylcyclohexanone, first 2,6-di-4'-azidobenzal cyclohexanone, and then 4,4'-diazidochalcone, similar results are obtained.

EXAMPLE 4

A chromium coated glass plate, as described in Example 1, is coated to give a dry thickness of 0.3 micron with a solution of 5 g. of cyclized polyisoprene and 0.5 g. of 4,4'-diazidostilbene in 100 cc. of xylene. The element is dried, imagewise exposed and then overall exposed by the procedure described in Example 1. After being developed in xylene and rinsed with butyl acetate, there is obtained a positive resist image which is useful as an etching resist.

The invention has been described in detail with particular reference to certain preferred embodiments thereof, but it will be understood that variations and modifications can be effected with the spirit and scope of the invention as described hereinabove and defined in the appended claims.

What is claimed is:

1. A method of producing a photomechanical reproduction which comprises the steps of:

(a) imagewise exposing in the presence of oxygen a layer of a photosensitive composition comprising an organic solvent-soluble polymeric colloid selected from the group consisting of natural rubber, synthetic rubber, cyclized rubber and oxidized rubber, and an oxygen-sensitive aryl azide sensitizer therefor, to desensitize the composition in exposed areas;

(b) overall exposing the imagewise exposed layer in the absence of oxygen to insolubilize the photosensitive composition in previously unexpected areas; and (c) developing a positive image by removing the composition from non-insolubilized areas with a solvent therefor.

2. A method as described in claim 1, wherein the aryl azide sensitizer is selected from the group consisting of aryl azides having the general formula:

$$N_3-R-CH=CH-R_1$$

$$N_3-R-\overset{\overset{O}{\|}}{C}-R_1$$

$$N_3-R-R_1$$

where R is a monocyclic arylene group and $R_1$ is a monocyclic aryl group, aryl azides having the general formula:

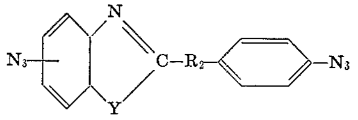

where $R_2$ is a polymethine chain and Y is a divalent radical selected from the group consisting of O, S, Se and NH, and aryl azide having the general formula:

$$N_3-R-CH=\underset{\underset{R_4}{|}}{C}-\overset{\overset{O}{\|}}{C}-R_5-R-N_3$$

where R is a monocyclic arylene group, $R_5$ is a $$-\underset{\underset{R_6}{|}}{C}=CH-$$

group or a chemical bond, and $R_4$ and $R_6$ are hydrogen atoms or when taken together with the $$C-\overset{\overset{O}{\|}}{C}-C$$

group represent the atoms necessary to complete a cyclohexanone group.

3. A method as described in claim 2, wherein the aryl azide sensitizer is a 2,6-di(4'-azidobenzal)-4-alkylcyclohexanone.

4. A method as described in claim 2, wherein imagewise exposing is performed while a jet of air is directed onto the surface of the layer, and overall exposing is performed while the layer is in a vacuum.

5. A method of producing a photomechanical reproduction which comprises the steps of:

(a) imagewise exposing a photographic element comprising a support and a layer of a photosensitive composition comprising an organic solvent soluble synthetic rubber and as a sensitizer therefor, 2,6-di(4'-azidobenzal)-4-alkylcyclohexanone, while directing a jet of air onto the surface of the photosensitive layer, to desensitize the photosensitive composition in exposed areas;

(b) overall exposing the element obtained from step (a) in a vacuum to insolubilize the photosensitive composition in areas which were not exposed in step (a); and (c) developing a positive image on the element by removing with a solvent therefor the non-insolubilized composition from the areas receiving both an imagewise and an overall exposure.

6. A method as defined in claim 5 wherein the layer of the photosensitive composition has a thickness of between about 0.1 to 0.6 millimicron.

7. A method as defined in claim 5 wherein the synthetic rubber is a styrene-butadiene copolymer and the aryl azide sensitizer is 2,6-di(4'-azidobenzal)-4-methylcyclohexanone.

8. A method as defined in claim 5 wherein the synthetic rubber is a polyisoprene and the aryl azide sensitizer is 2,6-di(4'-azidobenzal)-4-methylcyclohexanone.

References Cited

UNITED STATES PATENTS

| | | | |
|---|---|---|---|
| 3,475,176 | 10/1969 | Rauner | 96—35.1 |
| 3,380,825 | 4/1968 | Webers | 96—35.1 |

NORMAN G. TORCHIN, Primary Examiner

J. WINKELMAN, Assistant Examiner

U.S. Cl. X.R.

96—91(N), 115

PO-1050
(5/69)

UNITED STATES PATENT OFFICE
CERTIFICATE OF CORRECTION

Patent No. 3,591,378 Dated July 6, 1971

Inventor(s) Joseph H. Altman

It is certified that error appears in the above-identified patent and that said Letters Patent are hereby corrected as shown below:

Column 6, line 29, "unexpected" should read ---unexposed---.

Signed and sealed this 23rd day of November 1971.

(SEAL)
Attest:

EDWARD M.FLETCHER,JR.
Attesting Officer

ROBERT GOTTSCHALK
Acting Commissioner of Patents